(12) United States Patent
Xu et al.

(10) Patent No.: US 12,274,053 B2
(45) Date of Patent: Apr. 8, 2025

(54) SEMICONDUCTOR STRUCTURE AND METHOD FOR FORMING THE SAME

(71) Applicant: Fujian Jinhua Integrated Circuit Co., Ltd., Quanzhou (CN)

(72) Inventors: Yaoguang Xu, Quanzhou (CN); Chien-Cheng Tsai, Quanzhou (CN); Junyi Zheng, Quanzhou (CN); Jianshan Wu, Quanzhou (CN); Zhiyi Zhou, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 381 days.

(21) Appl. No.: 17/719,343

(22) Filed: Apr. 12, 2022

(65) Prior Publication Data
US 2023/0262966 A1    Aug. 17, 2023

(30) Foreign Application Priority Data

Feb. 17, 2022   (CN) .......................... 202210146991.9
Feb. 17, 2022   (CN) .......................... 202220325100.1

(51) Int. Cl.
*H10B 12/00*   (2023.01)
*H01L 21/768*  (2006.01)
*H01L 23/528*  (2006.01)

(52) U.S. Cl.
CPC ....... *H10B 12/50* (2023.02); *H01L 21/76816* (2013.01); *H01L 23/528* (2013.01); *H10B 12/09* (2023.02)

(58) Field of Classification Search
CPC ........ H10B 12/50; H10B 12/09; H10B 12/05; H01L 21/76816; H01L 23/528
See application file for complete search history.

(56) References Cited

U.S. PATENT DOCUMENTS

| | | | |
|---|---|---|---|
| 9,704,816 B1 * | 7/2017 | Huang | H01L 21/76229 |
| 2016/0233297 A1 | 8/2016 | Tomoyama | |
| 2019/0189620 A1 * | 6/2019 | Wang | H01L 21/76224 |
| 2020/0402981 A1 * | 12/2020 | Kim | H10B 12/485 |

* cited by examiner

*Primary Examiner* — Andres Munoz
*Assistant Examiner* — Ashley Nicole Blackwell
(74) *Attorney, Agent, or Firm* — Winston Hsu

(57) ABSTRACT

A semiconductor structure includes an array of active patterns, a peripheral pattern around the array of active patterns, and at least a branch pattern connected to an inner edge of the peripheral pattern. The active patterns respectively extend along a first direction and are arranged end-to-end along the first direction and side-by-side along a second direction that is different form the first direction. The branch pattern extends along the first direction. An end portion of the branch pattern and an end portion of one of the active patterns that is immediately side-by-side next to the branch pattern are flush along the second direction.

7 Claims, 13 Drawing Sheets

SEMICONDUCTOR STRUCTURE AND METHOD FOR FORMING THE SAME

BACKGROUND OF THE INVENTION

1. Field of the Invention

The present invention relates to a semiconductor structure and a method for forming the same. More particularly, the present invention relates to a semiconductor structure that includes an array pattern and a peripheral pattern and a method for forming the same.

2. Description of the Prior Art

A dynamic random access memory (DRAM) is one kind of volatile memory. A DRAM usually includes an array region including a plurality of memory cells and a peripheral region including control circuits. Typically, a memory cell includes one transistor and one capacitor electrically coupled to the transistor, which is known as a 1T1C cell. A digital data is stored in a memory cell by controlling the transistor to charge or discharge the capacitor. The control circuits in the peripheral region may address each of the memory cells in the array region by plural columns of word lines and plural rows of bit lines traversing through the array region and electrically connected to each of the memory cells to perform reading, writing or erasing data.

The fabrication of a dynamic random access memory usually includes the steps of defining a plurality of active regions on a semiconductor substrate, and then fabricating memory cells of the dynamic random access memory based on the active regions. How to fabricate a dynamic random access memory with a higher density of active regions to achieve a smaller chip size and a larger memory capacity is an important subject in the field.

SUMMARY OF THE INVENTION

One objective of the present invention is to provide a semiconductor structure and a method for forming the same. The semiconductor structure provided by the present invention includes an array of closely arranged active patterns, a peripheral pattern around the array of active patterns, and branch patterns that are connected to an inner edge of the peripheral pattern, wherein the active patterns, the peripheral pattern and the branch patterns are formed by cutting a plurality of parallel line patterns by a plurality of parallel trenches. The peripheral pattern may reinforce the array edge structure and be used as a stress buffer for releasing the stress at the edge of the array. Besides, the branch patterns may regulate the pattern density at the edge of the array to ensure that the insulating layer (such as the first insulating layer of the isolation structure) may completely fill the spaces between the peripheral pattern and the active regions.

One embodiment of the present invention provides a semiconductor structure including a substrate, an array of active patterns formed in the substrate, wherein the active patterns respectively extend along a first direction and are arranged end-to-end along the first direction and side-by-side along a second direction that is different form the first direction. The semiconductor structure further includes a peripheral pattern formed in the substrate and around the active patterns, and at least a branch pattern formed in the substrate and connected to an inner edge of the peripheral pattern, wherein the branch pattern extends along the first direction, an end portion of the branch pattern and an end portion of one of the active patterns that is immediately side-by-side next to the branch pattern are flush along the second direction.

Another embodiment of the present invention provides a method for forming a semiconductor structure including the following steps. First, a first patterned layer is formed on a substrate, wherein the first patterned layer comprises a group of line patterns that respectively extend along a first direction and are parallel to each other, and a peripheral pattern around the line patterns. Following, a second patterned layer is formed on the first patterned layer, wherein the second patterned layer comprises a plurality of trench patterns that respectively include a linear portion extending along a second direction and are parallel to each other. After that, an etching process is performed to etch the line patterns through the trench patterns to cut the line patterns to form an array of active patterns and at least a branch pattern that is connected to an inner edge of the peripheral pattern, wherein an end portion of the branch pattern and an end portion of one of the active patterns that is immediately side-by-side next to the branch pattern are flush along the second direction These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
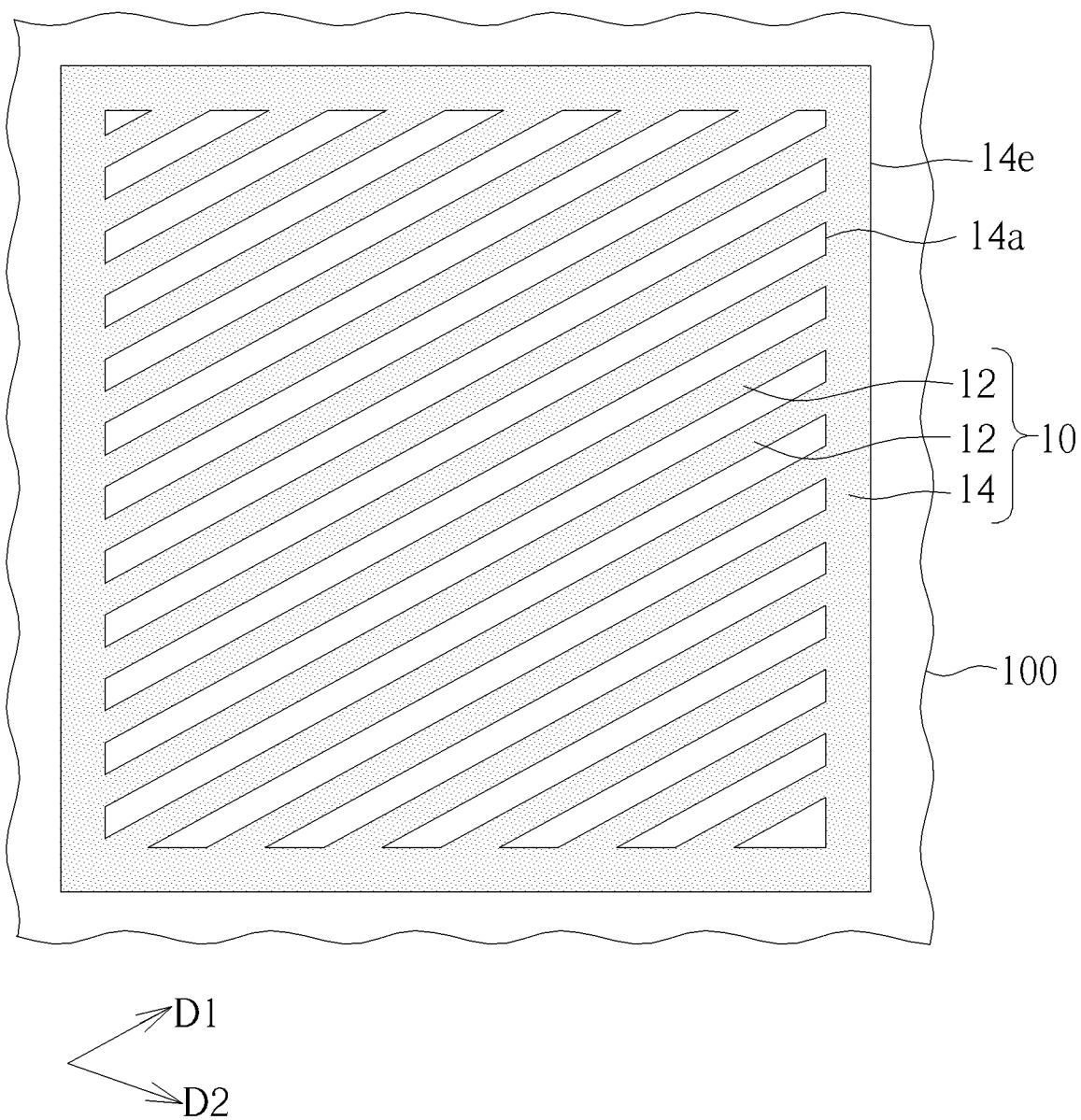
FIG. 1 to FIG. 4 are schematic plan views illustrating a method for forming a semiconductor structure according to one embodiment of the present invention.

Please refer to FIG. 1 to FIG. 4, which are schematic plan views illustrating a method for forming a semiconductor structure according to one embodiment of the present invention. In the beginning of the method, as shown in FIG. 1, a substrate 100 is provided. The substrate 100 may be a silicon substrate, an epitaxial silicon substrate, a silicon germanium (SiGe) substrate, a silicon carbide (SiC) substrate, or a silicon-on-insulator (SOI) substrate, but is not limited thereto. Subsequently, a first patterned layer 10 is formed on the substrate 100. The material of the first patterned layer 10 may include a photoresist or a dielectric material such as silicon oxide ($SiO_2$), silicon nitride (SiN) or silicon oxynitride (SiON), but is not limited thereto. According to an embodiment of the present invention, the first patterned layer 10 may include silicon nitride (SiN). The first patterned layer 10 includes a group of line patterns 12 that respectively extend along a first direction D1 and are parallel to each other. The first patterned layer 10 also includes a peripheral pattern 14 that is around the line patterns 12. The line ends of the line patterns 12 are all connected to the inner edge 14a of the peripheral pattern 14.

Figure 2:
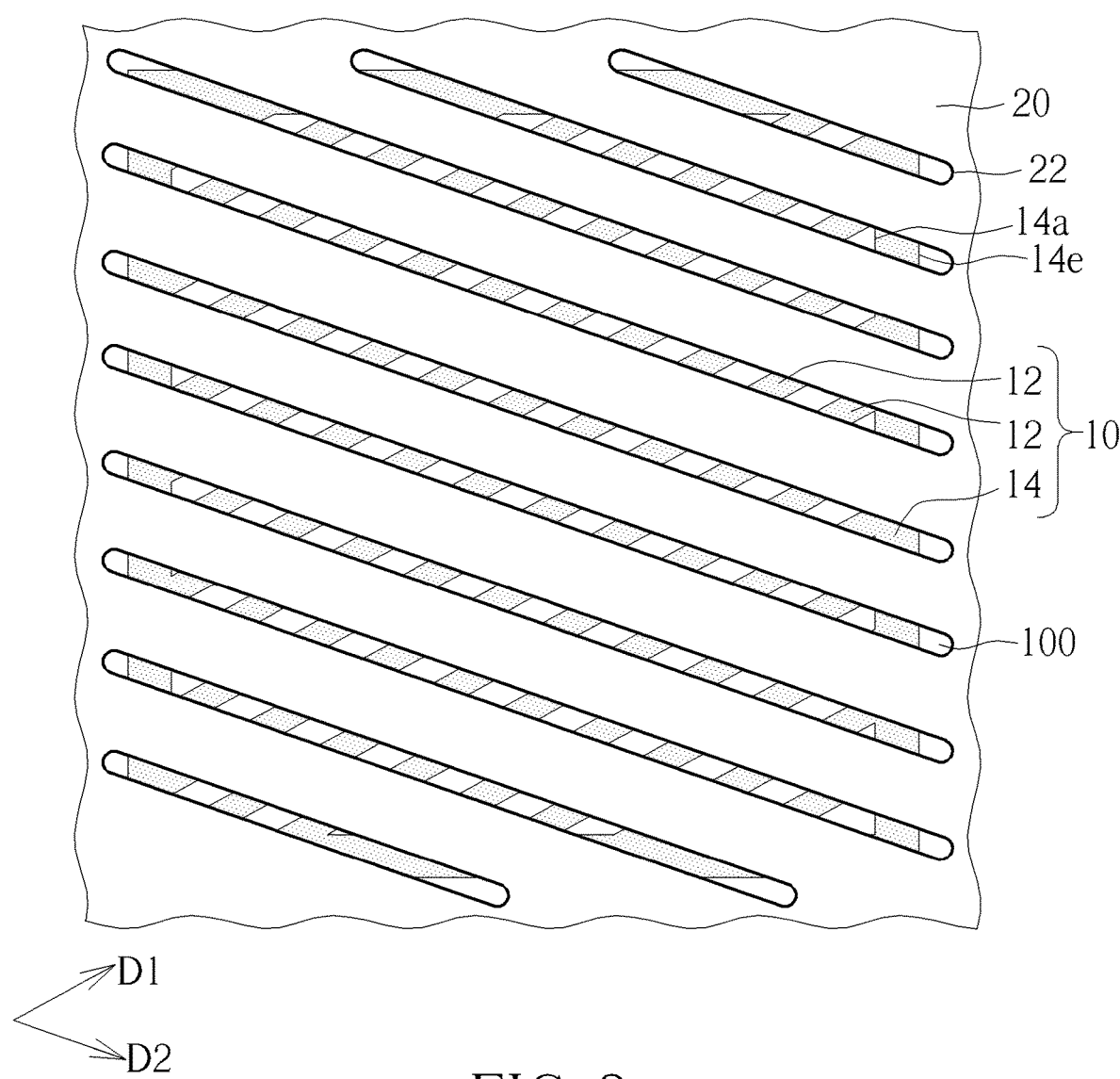

Subsequently, as shown in FIG. 2, a second patterned layer 20 is formed on the substrate 100 in a blanket manner and completely covers the first patterned layer 10. A patterning process (such as a photolithography-etching process) is then performed on the second patterned layer 20 to form a plurality of trench patterns 22 in the second patterned layer 20. The trench patterns 22 respectively extend linearly along a second direction D2 and are parallel to each other. The line patterns 12 and the peripheral pattern 14 of the first patterned layer 10 are partially exposed from the trench patterns 22 of the second patterned layer 20. The material of the second patterned layer 20 may include a photoresist or a dielectric material such as silicon oxide, silicon nitride or silicon oxynitride, but is not limited thereto. The first patterned layer 10 and the second patterned layer 20 have different materials. According to an embodiment of the present invention, the second patterned layer 20 may include a photoresist. The first direction D1 and the second direction D2 are different directions. According to an embodiment of the present invention, the angle between the first direction D1 and the second direction D2 may be between 15 and 130 degrees, but is not limited thereto. The angle between the first direction D1 and the second direction D2 may be adjusted according to design needs.

Figure 3:
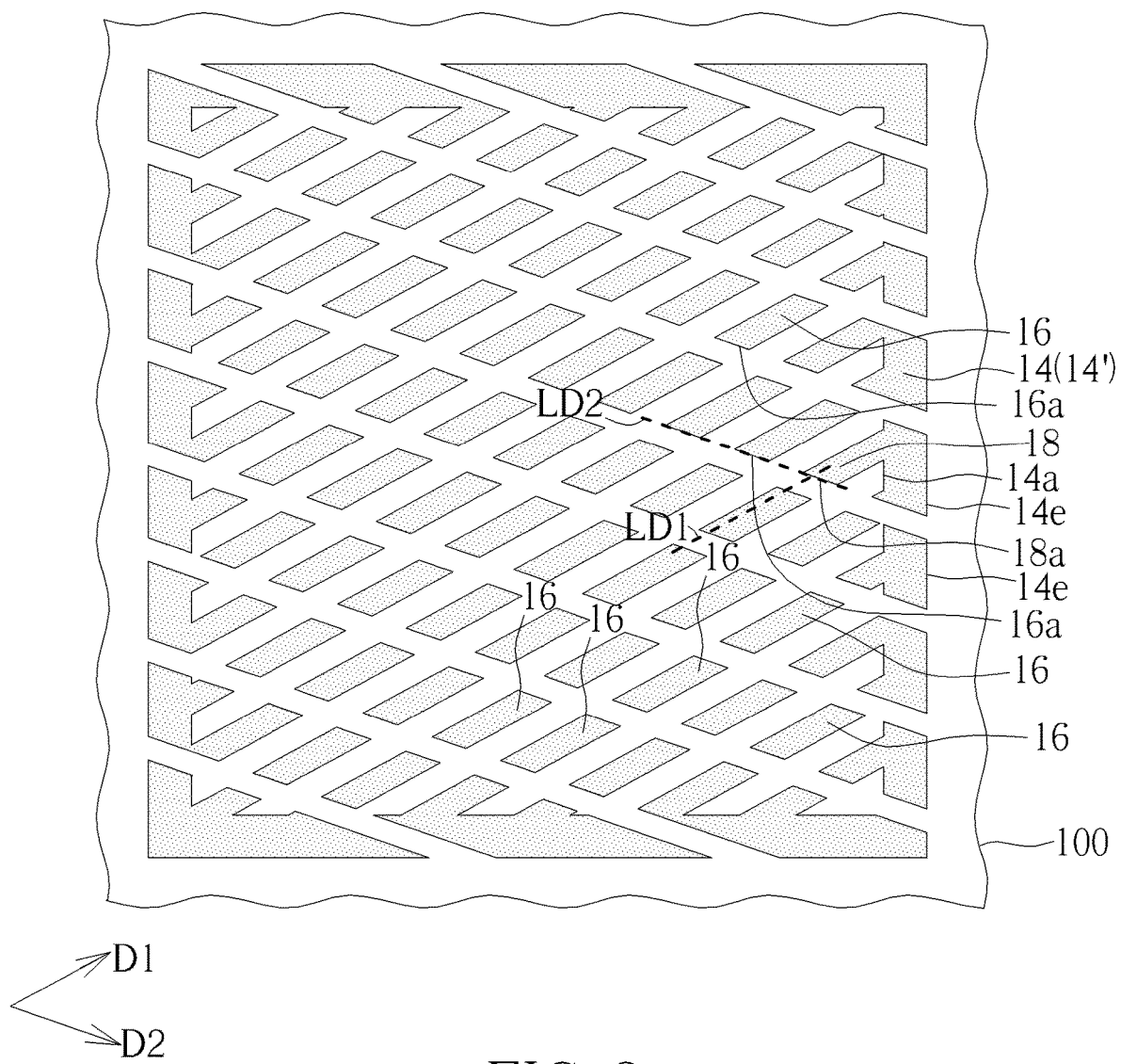

Subsequently, as shown in FIG. 3, an etching process may be performed, using the second patterned layer 20 as an etching mask to etch and remove the exposed portions of the line patterns 12 and the peripheral pattern 14 through the trench patterns 22, thereby cutting the line patterns 12 to form an array of active patterns 16 and at least a branch pattern 18 that is connected to the inner edge 14a of the peripheral pattern 14. The etching process also etches and removes the exposed portions of the peripheral pattern 14, so as to cut the peripheral pattern 14 into a plurality of peripheral block patterns 14'. The active patterns 16 respectively extend along the first direction D1 and are arranged end-to-end along the first direction D1 and side-by-side along the second direction D2 to form the array. The end portions 16a of the active patterns 16 that are arranged side-by-side along the second direction D2 are flush along the second direction D2 (for example, the end portions 16a are flush along the straight line LD2 as shown in FIG. 3). The end portion 18a of the branch pattern 18 is flush with the end portion 16a of one of the active pattern 16 that is immediately side-by-side next to the branch pattern 18 along the second direction D2 (for example, the end portion 18a and the end portion 16a are flush along the straight line LD2 as shown in FIG. 3). The array of active patterns 16 formed by cutting the line patterns 12 by the trench patterns 22 may achieve a higher pattern density and a larger process margin for the convenience of manufacturing.

Figure 4:
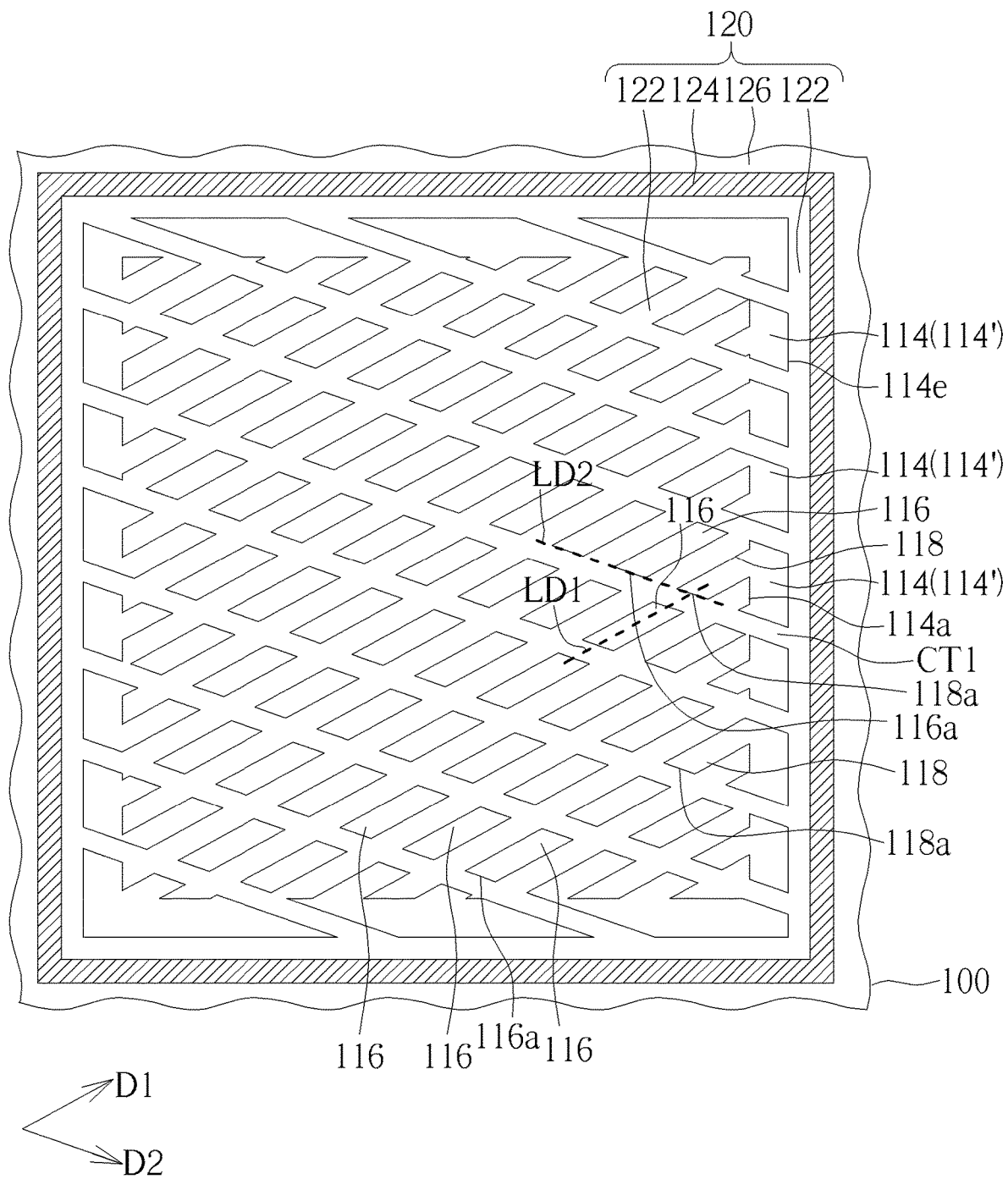

Subsequently, as shown in FIG. 4, the second patterned layer 20 is removed and an etching process using the first patterned layer 10 as an etching mask may be performed to etch and remove the portions of the substrate 100 exposed from the first patterned layer 10, thereby forming an isolation trench (not shown) in the substrate 100 to define an array of active patterns 116, a peripheral pattern 114 (including a plurality of peripheral block patterns 114' separated by the trenches CT1), and at least a branch pattern 118 in the substrate 100. Subsequently, dielectric materials may be formed to fill the isolation trench, thereby forming an isolation structure 120 in the substrate 100 to achieve electrical isolation between the active patterns 116 and provide a planar surface for fabricating other parts of the semiconductor structure in subsequent manufacturing processing.

According to an embodiment of the present invention, the isolation structure 120 may be formed by the following steps. First, an oxidation process (such as thermal oxidation process or ISSG oxidation process) may be performed to oxidize the substrate 100 to grow a first insulating layer 122 along the surface of the substrate 100. According to another embodiment of the present invention, the first insulating layer 122 may be formed by performing a deposition process with a good gap filling capability (such as an ALD process). The thickness of the first insulating layer 122 may be controlled by the process time of the oxidation process or the deposition process to be at least sufficient to completely fill the isolation trench surrounded by the peripheral pattern 114 (including the isolation trench between the active patterns 116 and the isolation trench between the active patterns 116, the peripheral pattern 114 and the branch pattern 118, and the trenches CT1 between the peripheral block patterns 114'). Afterward, a deposition process (such as a CVD process, PVD process, or an ALD process) may be performed to successively form a second insulating layer 124 and a third insulating layer 126 on the substrate 100, wherein the third insulating layer 126 is the main filling material to fill the isolation trench outside the peripheral pattern 114. A planarization process (such as a CMP process) may be performed to remove the overburden third insulating layer 126, second insulating layer 124, and first insulating layer 122 outside the isolation trench until top surfaces of the active patterns 116, peripheral pattern 114, and the branch pattern 118 are exposed, so that the semiconductor structure as shown in FIG. 4 may be obtained. The first insulating layer 122, the second insulating layer 124, and the third insulating layer 126 respectively include a dielectric material. According to another embodiment of the present invention, the first insulating layer 122 includes silicon oxide ($SiO_2$), the second insulating layer 124 includes silicon nitride (SiN), and the third insulating layer 126 includes silicon oxide ($SiO_2$) or a low-k dielectric material. The second insulating layer 124 may alleviate loss of the first insulating layer 122 between the outer edge 114e of the peripheral pattern 114 and the second insulating layer 124 during subsequent processes, so that defects caused by divot in the first insulating layer 122 may be prevented.

Please still refer to FIG. 4 in the following detailed description of the semiconductor structure provided by the present invention. The semiconductor structure provided by the present invention may be used to form a dynamic random access memory (DRAM) device. The semiconductor structure includes a substrate 100, an array of active patterns 116 disposed in the substrate 100, a peripheral pattern 114 disposed in the substrate 100 and around the active patterns 116, and a plurality of branch patterns 118 connected to an inner edge 114a of the peripheral pattern 114. The active patterns 116 respectively extend lengthwise along a first direction D1 and are arranged end-to-end along the first direction D1 and side-by-side along a second direction D2 to form the array. The active patterns 116 that are end-to-end along the first direction D1 may have the end portions 116a thereof aligned along the first direction D1 (for example, the end portions 116a are aligned along the straight line LD1 as shown in FIG. 4). The active patterns 116 that are side-by-side along the second direction D2 may have the end portions 116a thereof flush with each other along the second direction D2 (for example, the end portions 116a are flush along the straight line LD2 as shown in FIG. 4). The peripheral pattern 114 around the array of the active patterns 116 includes a plurality of peripheral block patterns 114' that are separated by the trenches CT1, wherein the trenches CT1 (particularly, edges of the trenches CT1) are on a straight line extending along the second direction D2 and tangent to the end portions 116a of some of the active patterns 116 (for example, the straight line LD2 shown in FIG. 4). The branch patterns 118 respectively extend lengthwise along the first direction D1 and are aligned end-to-end to the active patterns 116 along a straight line extending along the first direction D1 (for example, the straight line LD1 shown in FIG. 4). The branch patterns 118 may have different lengths. It is noteworthy that, at least one of the branch patterns 118 may have an end portion 118a flush with the end portion 116a of the active pattern 116 that is immediately side-by-side next to the said branch pattern 118 along the second direction D2 (for example, the along the straight line LD2 shown in FIG. 4). An isolation structure 120 is disposed in the substrate 100, around the peripheral pattern 114 and filling the spaces between the active patterns 116, the peripheral pattern 114, and the branch patterns 118 (the trenches CT1 between the peripheral block patterns 114' are also filled by the isolation structure 120). The isolation structure 120 provides electrical isolation between the active patterns 116 and also provides a planar surface for fabricating other parts of the semiconductor structure in subsequent manufacturing processing. As shown in FIG. 4, the isolation structure 120 may have a multilayer structure including a first insulating layer 122, a second insulating layer 124, and a third insulating layer 126. The first insulating layer 122 is around the outer edge 114e of the peripheral pattern 114 and fills the spaces between the active patterns 116, the peripheral pattern 114, and the branch patterns 118. The second insulating layer 124 is around the outer edge 114e of the peripheral pattern 114 and is separated from the peripheral pattern 114 by the first insulating layer 122. The third insulating layer 126 is around the second insulating layer 124. One advantage of the present invention is that the active patterns 116, the peripheral pattern 114 and the branch patterns 118 as illustrated above may be formed by a process with a larger process window and the obtained array of active patterns may achieve a higher array density. Furthermore, the branch patterns 118 may regulate the pattern density at the edge of the array to be more similar to the pattern density of other portion of the array. That is, the isolation trench enclosed by the peripheral pattern 114 (the isolation trench in the array region, including the portion between the active patterns 116 and the portion between the active patterns 116, the peripheral pattern 114, and the branch patterns 118) may have a more uniform pattern density and dimension that is easier to be completely filled by the first insulating layer 122. Accordingly, the chance for other insulating materials (such as the second insulating layer 124) to fill into the isolation trench enclosed by the peripheral pattern 114 is reduced. In other words, it may be ensured that the isolation trench within the peripheral pattern 114 (the isolation trench in the array region) is completely filled by the first insulating layer 122. This is beneficial for controlling the line widths of the buried word lines in the array region since the word line trenches may be formed by only etching through the material of the substrate 100 and the first insulating layer 122 in the array region, so that problems of line narrowing caused by etching through other additional materials may be prevented. Besides, the branch patterns 118 connected to the peripheral pattern 114 may provide additional structural support and be used as a stress buffer for releasing the stress at the edge of the array.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
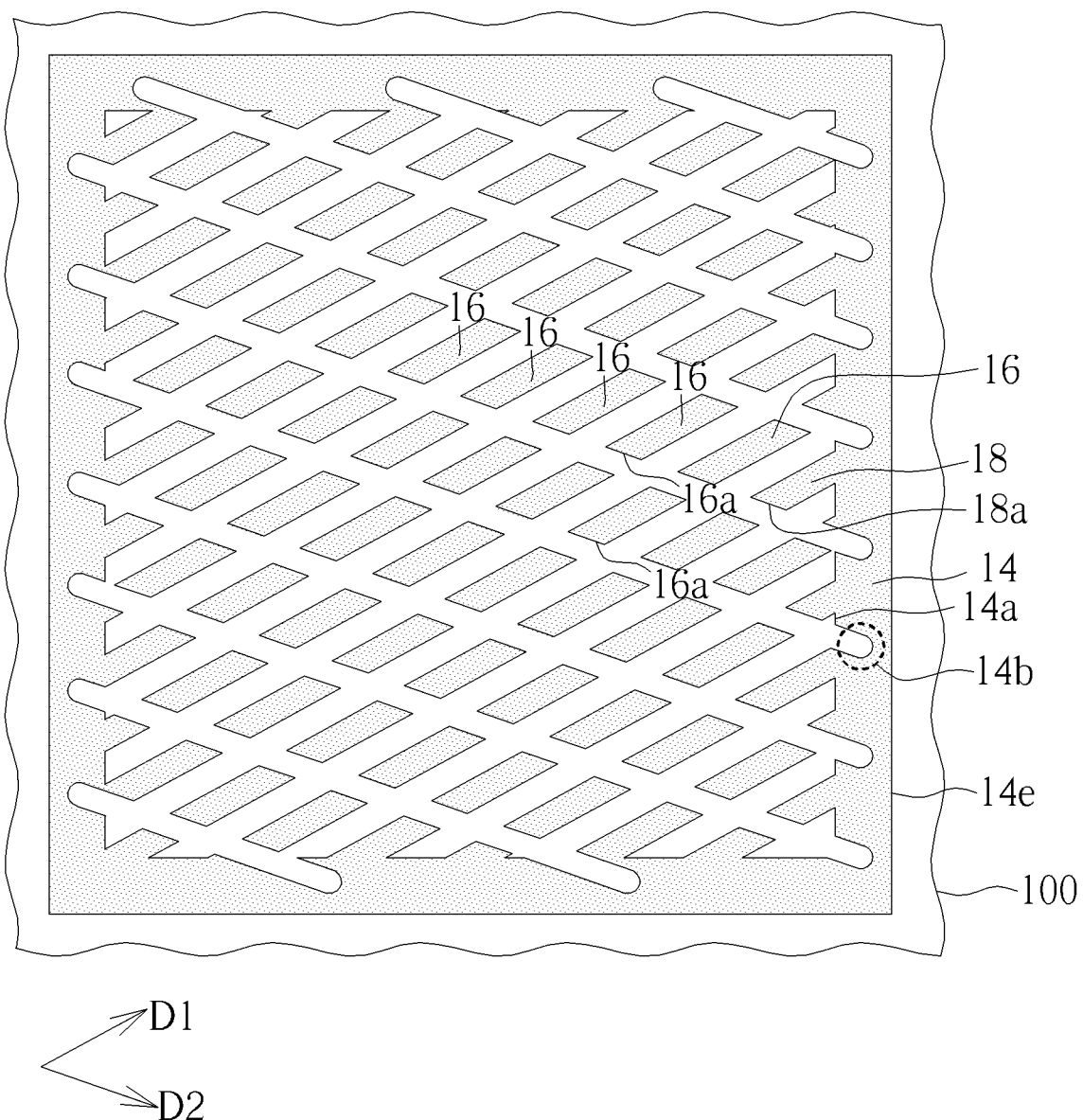
FIG. 5 and FIG. 6 are schematic plan views illustrating a modified embodiment of the process shown in FIG. 3 and FIG. 4.
Figure 6:
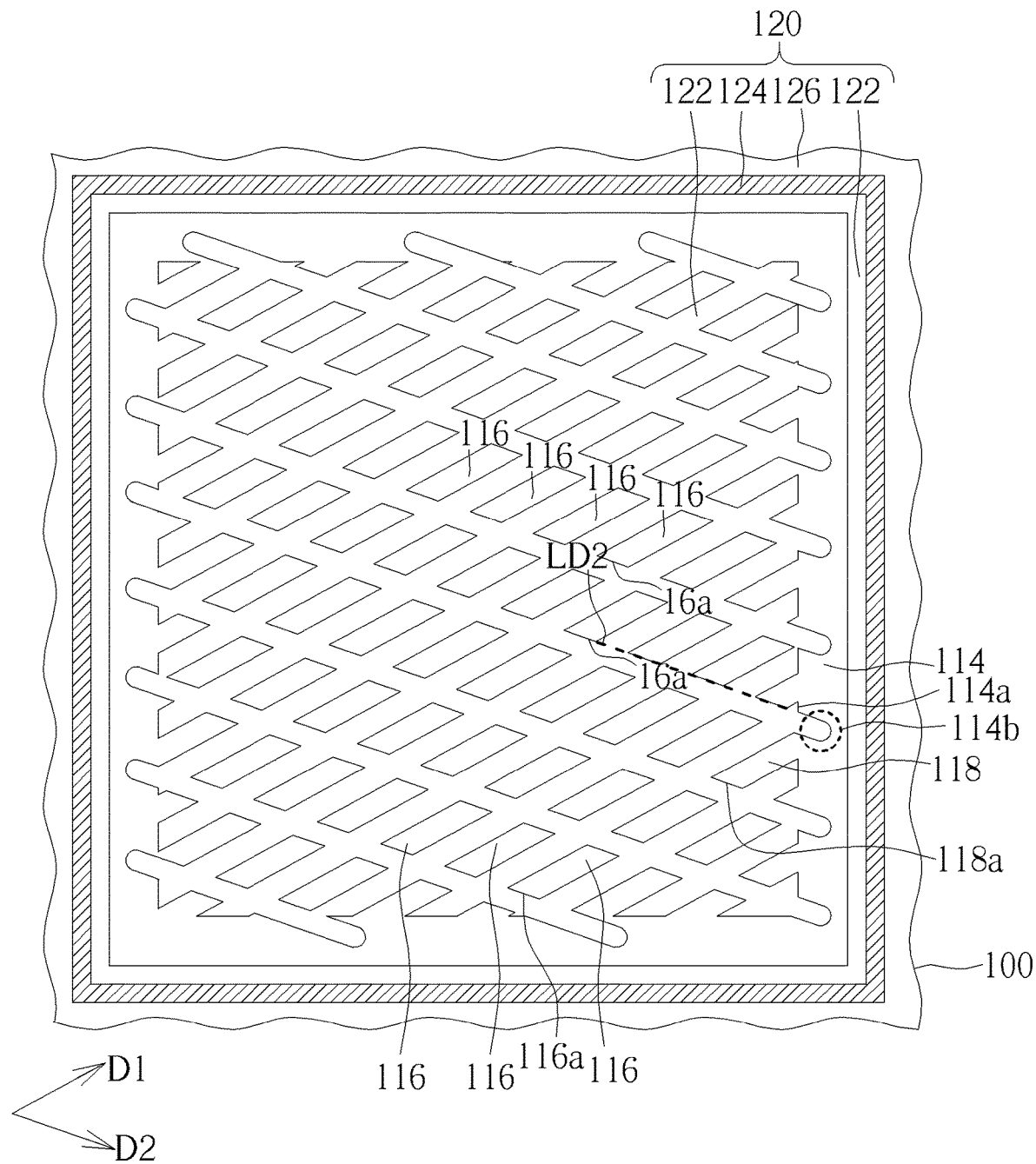

Please refer to FIG. 5 and FIG. 6, which are schematic plan views illustrating a modified embodiment of the process shown in FIG. 3 and FIG. 4. As shown in FIG. 5, by adjusting the length of the trench patterns 22 of the second patterned layer 20 (shown in FIG. 2) not to extend beyond the outer edge 14e of the peripheral pattern 14, the peripheral pattern 14 formed by etching the first patterned layer 10 by using the second patterned layer 20 as an etching mask may have a plurality of notch portions 14b on the inner edge 14a thereof. Unlike the peripheral pattern 14 shown in FIG. 3 that is cut into a plurality of separated peripheral block patterns 14', the peripheral pattern 14 shown in FIG. 5 has a continuous closed ring shape. Following, as shown in FIG. 6, the substrate 100 is patterned to form the array of active patterns 116 and the peripheral pattern 114 around the array of active patterns 116 by using the first patterned layer 10 as an etching mask to etch the substrate 100. Inheriting from the peripheral pattern 14 of the first patterned layer 10, a plurality of notch portions 114b are formed on the inner edge 114a of the peripheral pattern 114, wherein the notch portions 114b are respectively on a straight line extending along the second direction D2 and tangent to the end portions 116a of some of the active patterns 116 (such as the straight line LD2 shown in FIG. 6).

Figure 7:
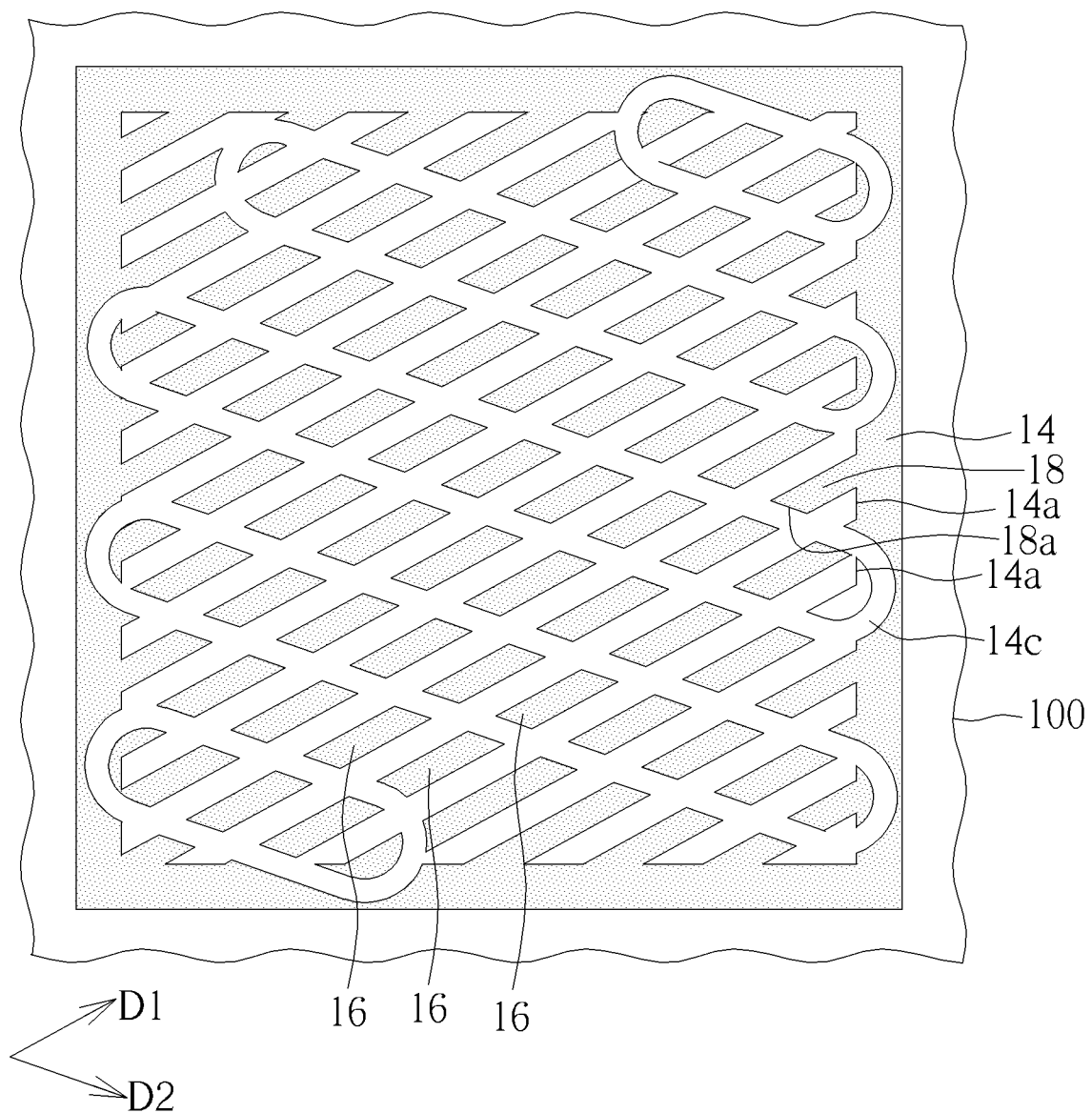
FIG. 7 and FIG. 8 are schematic plan views illustrating another modified embodiment of the process shown in FIG. 3 and FIG. 4.
Figure 8:
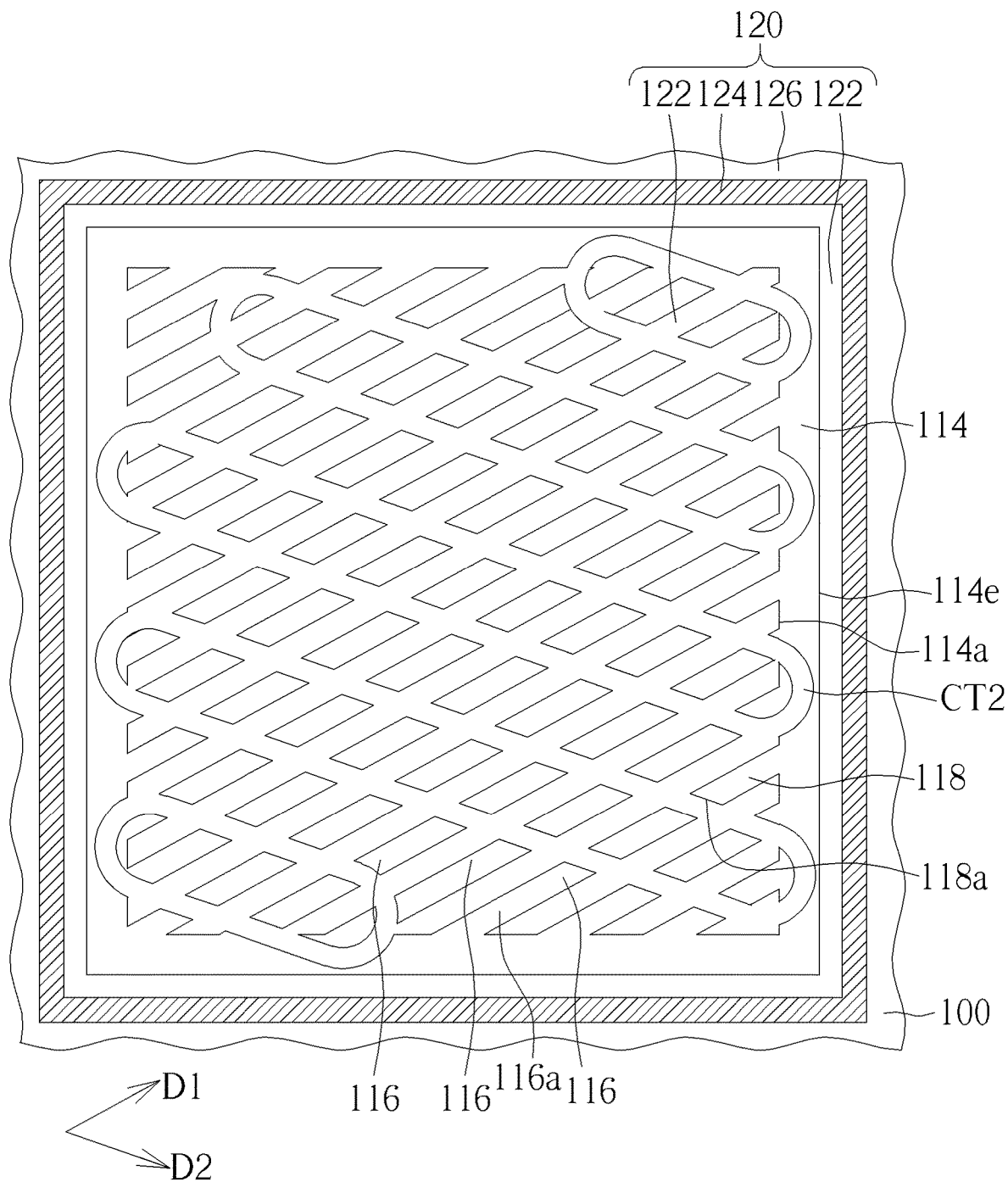

Please refer to FIG. 7 and FIG. 8, which are schematic plan views illustrating another modified embodiment of the process shown in FIG. 3 and FIG. 4. As shown in FIG. 7, by performing a sidewall spacer image transfer process or any suitable process, a plurality of ring shaped trench patterns 22 may be formed in the second patterned layer 20 (refer to FIG. 2). The ring shaped trench patterns 22 respectively include linear portions extending along the second direction and curved portions at the ends of the trench patterns 22. The first patterned layer 10 is then etched, using the second patterned layer 20 as an etching mask to form the array of active patterns 16 and the peripheral pattern 14 around the array of active patterns 16. Inheriting from the curved portions of the trench patterns 22, the peripheral pattern 14 of the first patterned layer 10 has a plurality of curved trenches 14c cutting from the inner edge 14a into the peripheral pattern 14. Following, as shown in FIG. 8, by using the first patterned layer 10 as an etching mask to etch the substrate 100, the substrate 100 is patterned to form the array of active patterns 116 and the peripheral pattern 114 around the array of active patterns 116. The shape of the peripheral pattern 114 is inherited from the peripheral pattern 14 of the first patterned layer 10. A plurality of curved trenches 114c are formed in the substrate 100 and cut from the inner edge 114a into the peripheral pattern 114.

Figure 9:
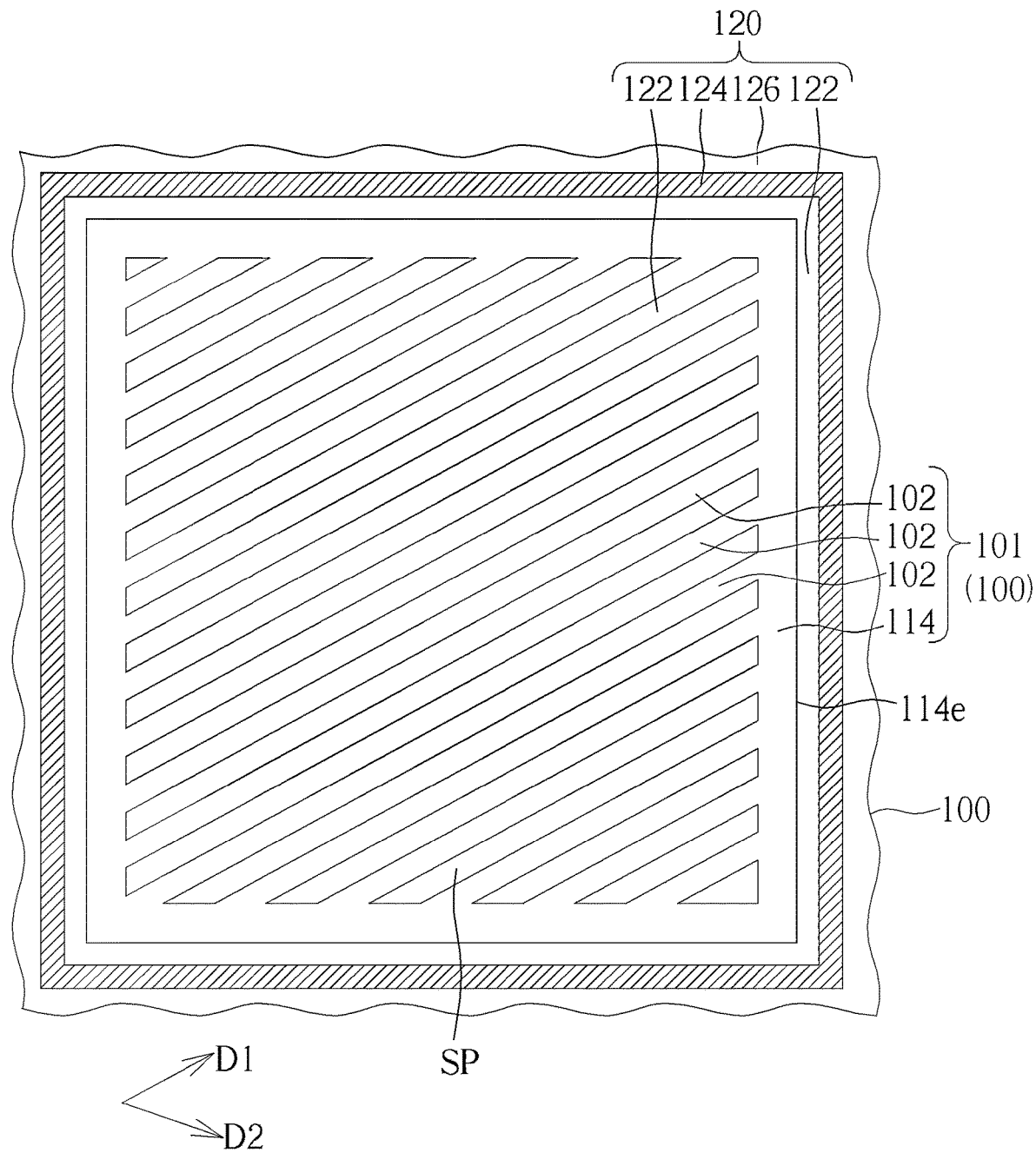
FIG. 9 to FIG. 11 are schematic plan views illustrating a method for forming a semiconductor structure according to another embodiment of the present invention.
Figure 10:
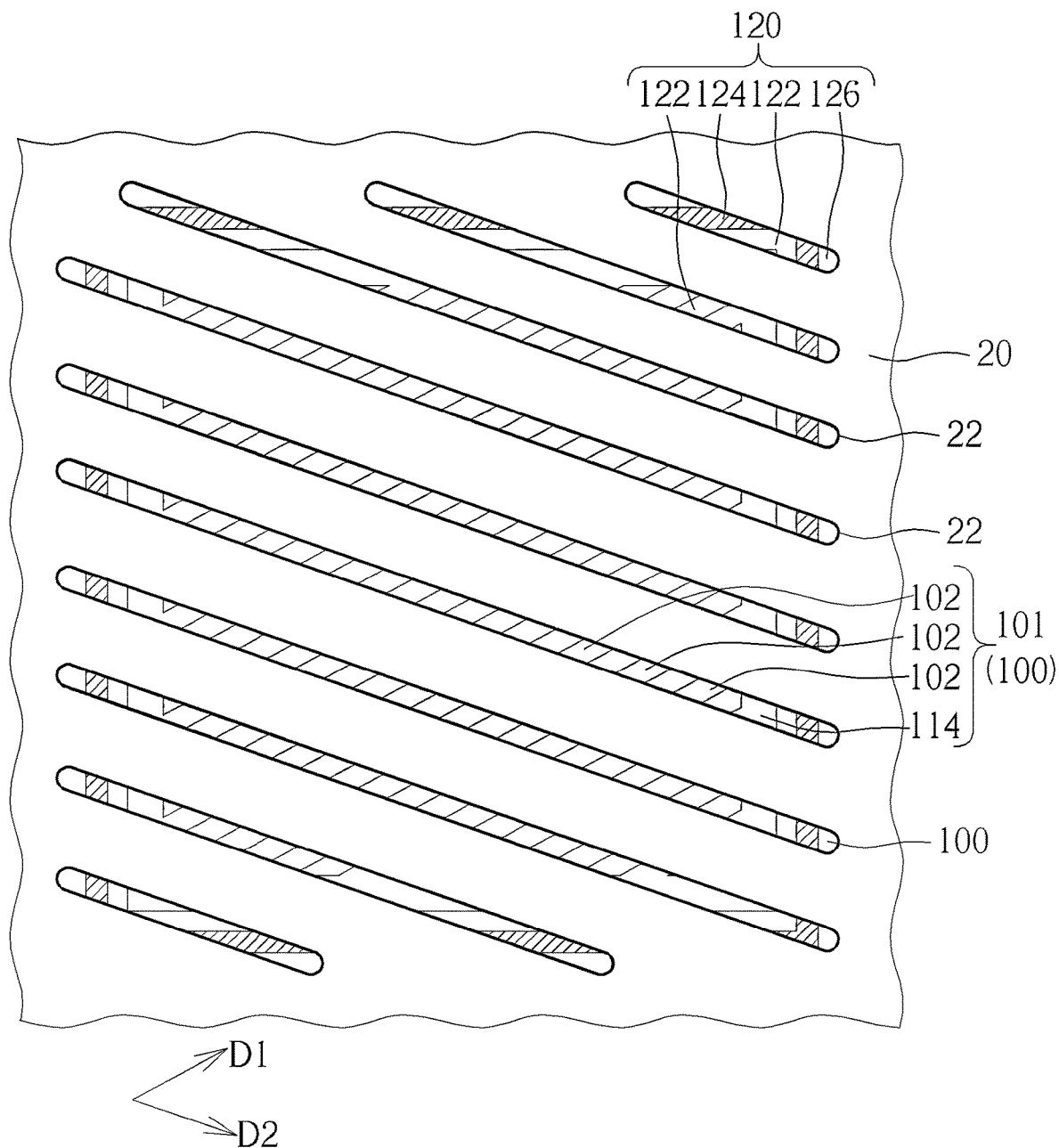
Figure 11:
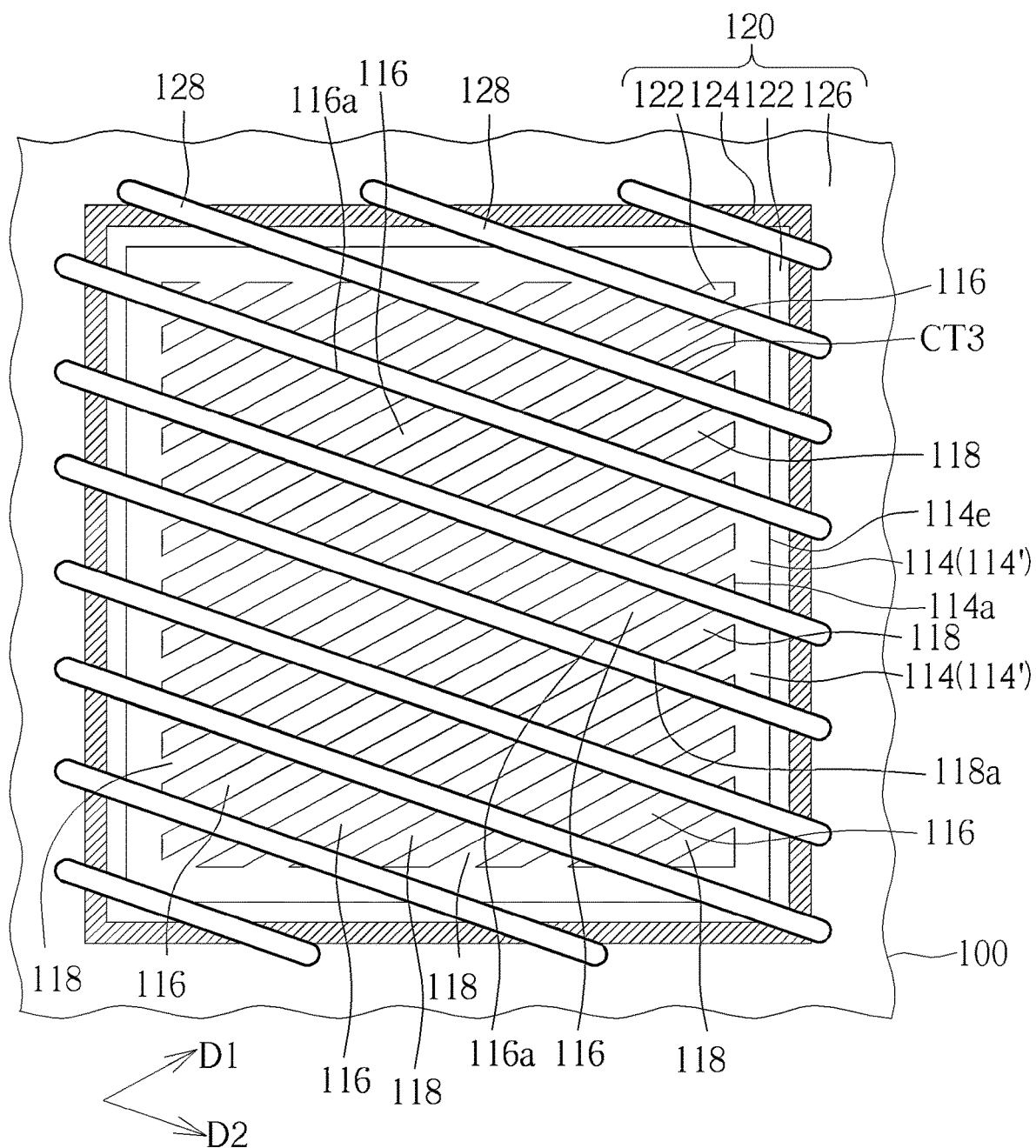

Please refer to FIG. 9 to FIG. 11, which are schematic plan views illustrating a method for forming a semiconductor structure according to another embodiment of the present invention. A main difference between the embodiment shown in FIG. 1 to FIG. 4 and the embodiment shown in FIG. 9 to FIG. 11 is that the first patterned layer 101 is a patterned upper thickness portion of the substrate 100 instead of an additional layer disposed on the substrate 100. More specifically, as shown in FIG. 9, a patterning process (such as a photolithography-etching process) may be performed on the substrate 100 to form an isolation trench SP in the substrate 100 to define a group of line patterns 102 in the substrate 100 and a peripheral pattern 114 around the group of line patterns 102. The line patterns 102 respectively extend along the first direction D1 and are parallel to each other. The peripheral pattern 114 is around the group of line patterns 102. The end portions of the line patterns 102 are connected to the inner edge of the peripheral pattern 114. Subsequently, an isolation structure 120 is formed on the substrate 100 and fills the isolation trench SP. The isolation structure 120 may include a first insulating layer 122 that fills the spaces between the line patterns 102 and surrounds the outer edge 114e of the peripheral pattern 114, a second insulating layer 124 that surrounds the outer edge 114e of the peripheral pattern 114 and is separated from the peripheral pattern 114 by the first insulating layer 122, and a third insulating layer 126 that surrounds the second insulating layer 124. The method to form the isolation structure 120 has been illustrated in previous paragraphs and will not be repeated herein. Subsequently, as shown in FIG. 10, a second patterned layer 20 is formed on the line patterns 102, the peripheral pattern 114, and the isolation structure 120. The second patterned layer 20 is then patterned to form a plurality of trench patterns 22 to expose portions of the line patterns 102, the peripheral pattern 114, and the isolation structure 120. The trench patterns 22 respectively extend along the second direction D2 and are parallel to each other. Following, as shown in FIG. 11, an etching process is carried out, using the second patterned layer 20 as an etching mask to etch the exposed portions of the line patterns 102, the peripheral pattern 114 and the isolation structure 120, thereby forming a plurality of trenches CT3 in the substrate 100. The trenches CT3 extend along the second direction D2 to cut the line patterns 102 to form an array of active patterns 116 and the branch patterns 118. The peripheral pattern 114 is also cut by the trenches CT3 to form a plurality of separated peripheral block patterns 114'. It is noteworthy that the first insulating layer 122 and the second insulating layer 124 around the outer edge 114e of the peripheral pattern 114 are also cut by the trenches CT3 and become discontinued (have a discontinuous shape) from the plan view. Subsequently, a fourth insulating layer 128 is formed to fill the trenches CT3 to achieve electrical isolation between the active patterns 116 and also provide a planar surface for fabricating other parts of the semiconductor structure in subsequent manufacturing processing. The fourth insulating layer 128 includes a dielectric material, such as silicon oxide ($SiO_2$) or a low-k dielectric material. According to an embodiment of the present invention, the fourth insulating layer 128 and the first insulating layer 122 may include a same dielectric material, such as silicon oxide.

Figure 12:
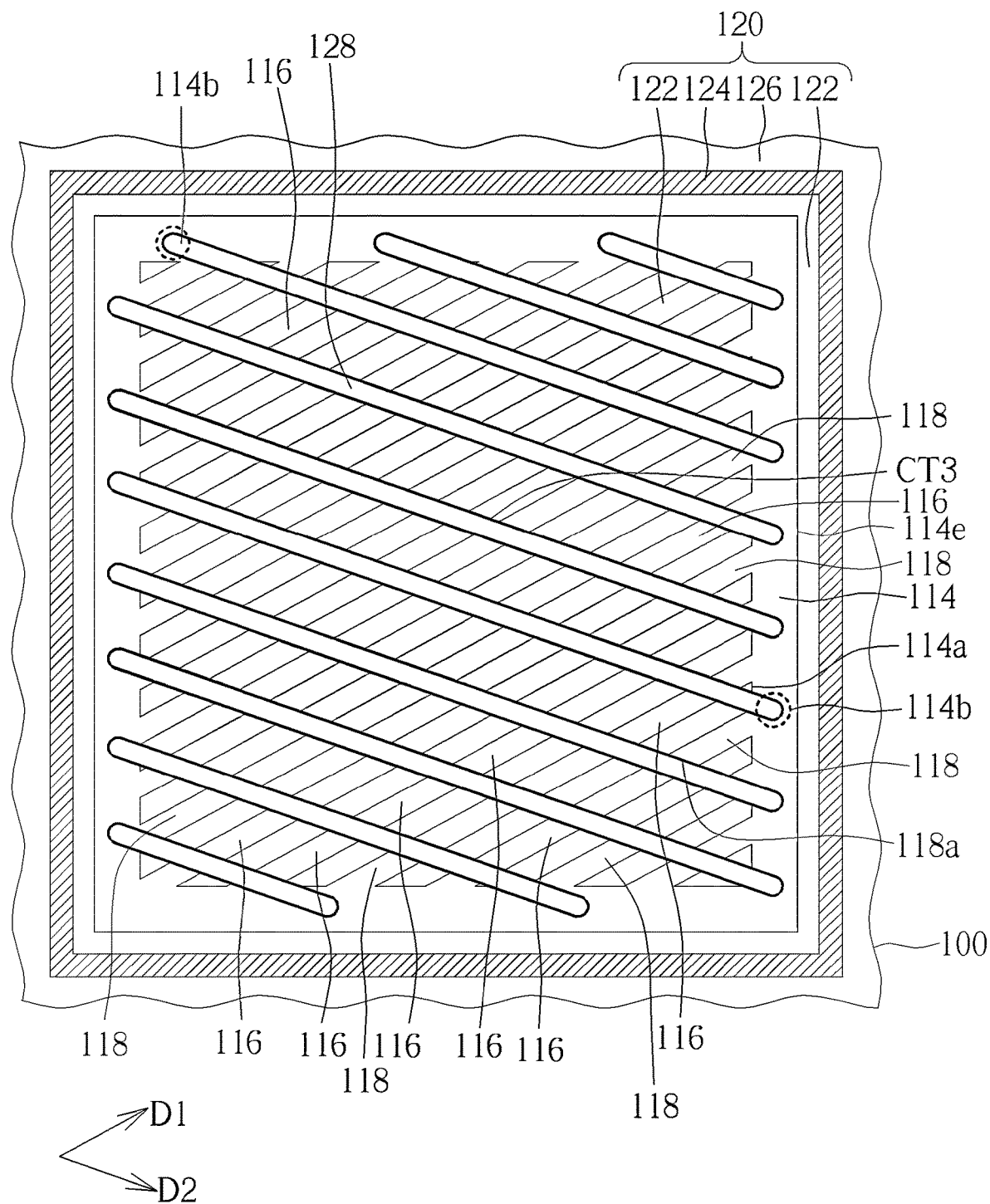
FIG. 12 is a schematic plan view illustrating a modified embodiment of the semiconductor structure shown in FIG. 11.

Please refer to FIG. 12, which is a schematic plan view illustrating a modified embodiment of the semiconductor structure as shown in FIG. 11. By adjusting the length of the trench patterns 22 of the second patterned layer 20 (refer to FIG. 10) not to extend beyond the outer edge 104e of the peripheral pattern 104, the trenches CT3 formed by using the second patterned layer 20 as an etching mask to etch the substrate 100 and the isolation structure 120 may have end portions thereof cut into the peripheral pattern 114 from the inner edge 114a and terminate in the peripheral pattern 114, thereby forming a plurality of notch portions 114b on the inner edge 114a of the peripheral pattern 114. Unlike the peripheral pattern 114 shown in FIG. 11 that is cut into a plurality of separated peripheral block patterns 114', the peripheral pattern 114 shown in FIG. 12 has a continuous closed ring shape. The first insulating layer 122 and the second insulating layer 124 around the outer edge 114e of the peripheral pattern 114 also have a continuous in shape, respectively.

Figure 13:
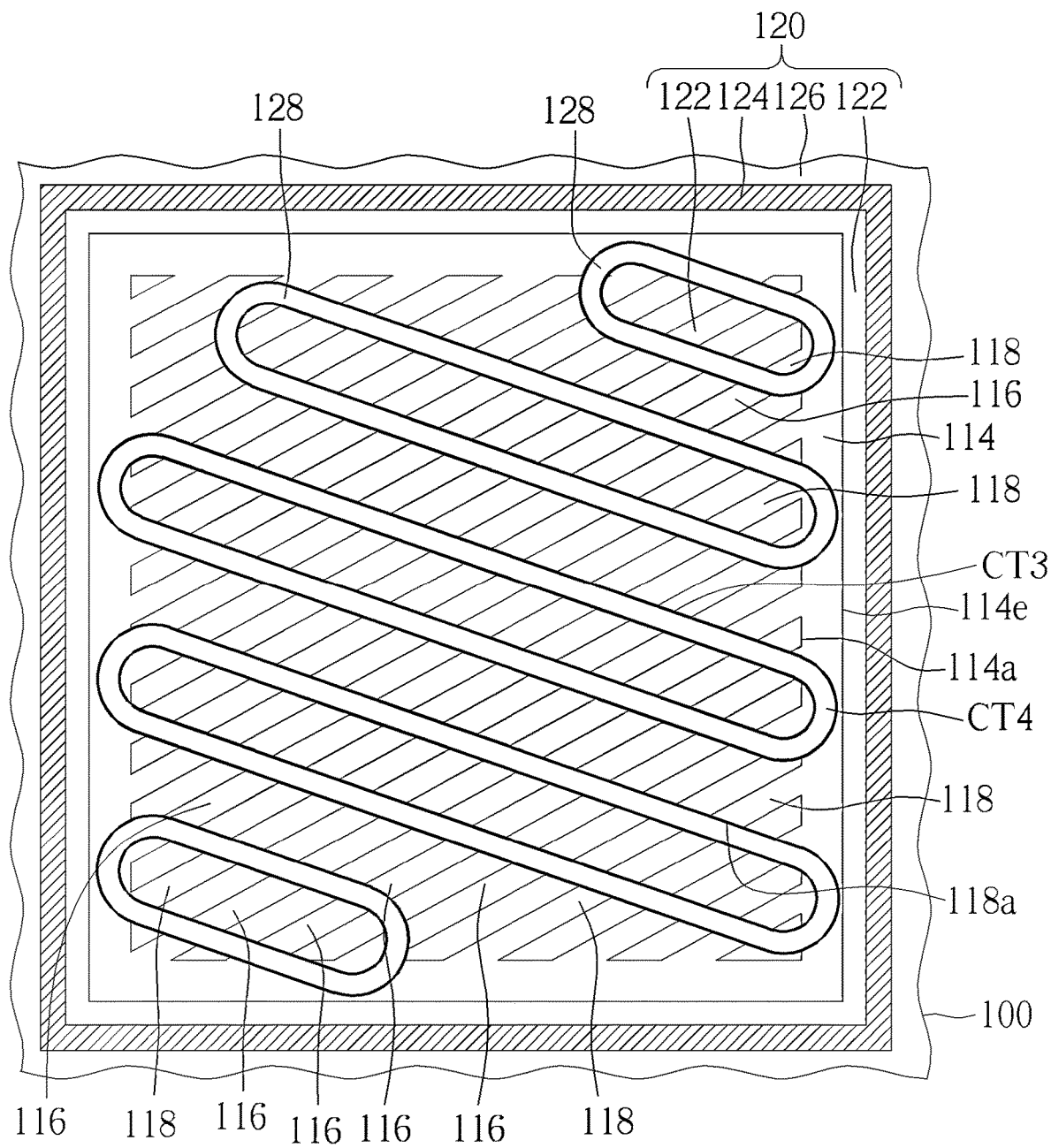
FIG. 13 is a schematic plan view illustrating another modified embodiment of the semiconductor structure shown in FIG. 11.

Please refer to FIG. 13, which is a schematic plan view illustrating another modified embodiment of the semiconductor structure as shown in FIG. 11. By performing a sidewall spacer image transfer process or any suitable process, a plurality of ring shaped trench patterns 22 may be formed in the second patterned layer 20 (refer to FIG. 10). Accordingly, after using the second patterned layer 20 as an etching mask to etch the substrate 100 and the insulating layer 120, a plurality of curved trenches CT4 may be formed and cut into the peripheral pattern 114 from the inner edge 114a of the peripheral pattern 114. As shown in FIG. 13, the trenches CT3 and the curved trenches CT4 are connected to form a plurality of ring shaped trenches in the substrate 100.

In summary, the present invention provides a semiconductor structure and a method for forming the same, wherein the array pattern (the array of closely arranged active patterns), the peripheral pattern around the array pattern, and the branch patterns connected to the inner edge of the peripheral pattern are formed by cutting a plurality of parallel line patterns by parallel trenches. In some embodiments, the cutting process is performed on a hard mask layer to cut the line patterns defined in the hard mask layer, and a subsequent pattern transferring process is performed to transfer the pattern of the hard mask layer to a semiconductor substrate. In other embodiments, the cutting process may be performed to cut the line patterns defined in a semiconductor substrate. The peripheral pattern may reinforce the array edge structure and be used as a stress buffer for releasing the stress at the edge of the array. The branch patterns may regulate the pattern density at the edge of the array to ensure that the insulating layer (such as the first insulating layer of the isolation structure) may completely fill the spaces between the peripheral pattern and the active regions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   an array of active patterns formed in the substrate, wherein the active patterns respectively extend along a first direction and are arranged end-to-end along the first direction and side-by-side along a second direction that is different form the first direction;

a peripheral pattern formed in the substrate and around the array of active patterns;

at least a branch pattern formed in the substrate and connected to an inner edge of the peripheral pattern, wherein the active patterns, the peripheral pattern, and the branch pattern are made of a same material, the branch pattern extends along the first direction, an end portion of the branch pattern and an end portion of one of the active patterns that is immediately side-by-side next to the branch pattern are flush along the second direction;

a second insulating layer around an outer edge of the peripheral pattern;

a plurality of trenches extending along the second direction, passing between the ends of the active patterns, and at least crossing through the peripheral pattern and the second insulating layer; and a fourth insulating layer filling the trenches.

2. The semiconductor structure according to claim 1, wherein an angle between the first direction and the second direction is between 15 and 130 degrees.

3. The semiconductor structure according to claim 1, wherein the branch pattern and another one of the active patterns are end-to-end aligned along a straight line extending along the first direction.

4. The semiconductor structure according to claim 1, wherein the plurality of trenches cut the peripheral pattern into a plurality of peripheral block patterns, wherein the trenches are tangent to end portions of the active patterns.

5. The semiconductor structure according to claim 1, wherein the peripheral pattern and the second insulating layer are discontinuous from a plan view.

6. The semiconductor structure according to claim 1, further comprising:
 a first insulating layer between the active patterns and around the outer edge of the peripheral pattern, wherein the second insulating layer is separated from the peripheral pattern by the first insulating layer; and
 a third insulating layer around the second insulating layer.

7. The semiconductor structure according to claim 1, wherein the fourth insulating layer are between end portions of the active patterns that are arranged end-to-end along the first direction.

* * * * *